United States Patent [19]

Rendina et al.

[11] 3,967,127
[45] June 29, 1976

[54] SAMPLE INTRODUCER
[75] Inventors: John F. Rendina, Boxborough; Paul E. Larson, Acton, both of Mass.
[73] Assignee: GCA Corporation, Bedford, Mass.
[22] Filed: July 3, 1975
[21] Appl. No.: 592,807

[52] U.S. Cl. ............................ 250/441; 250/442
[51] Int. Cl.² ........................................ H01J 37/20
[58] Field of Search ........... 250/439, 440, 441, 442, 250/443, 306, 307, 309, 310, 311

[56] References Cited
UNITED STATES PATENTS

| | | | |
|---|---|---|---|
| 2,264,209 | 11/1941 | Kraase | 250/441 |
| 2,508,317 | 5/1950 | Verhoeff | 250/441 |
| 2,602,899 | 7/1952 | Page | 250/441 |

*Primary Examiner*—Craig E. Church
*Attorney, Agent, or Firm*—Kenway & Jenny

[57] ABSTRACT

In the sample introducer system disclosed herein, a sample-carrying probe engages and releases, from a sample-introducing port, a plug which closes the port when the probe is not in place. The probe then carries the plug ahead of itself into an evacuated chamber where the sample may be analyzed. Upon withdrawal of the probe, the plug is replaced so as to seal the port.

6 Claims, 8 Drawing Figures

SAMPLE INTRODUCER

BACKGROUND OF THE INVENTION

This invention relates to a sample introducing system and more particularly to a system for introducing samples into an evacuated chamber for analysis without venting any significant volume of air into the chamber.

The invention is useful, for example, in introducing a sample into the evacuated chamber of an electron spectrometer or electron microscope. In Instruments of this type, the analysis chamber is under vacuum and significant time is required to pump out the chamber after it is opened to the atmosphere. The typical prior art practice for introducing and removing samples involves an air lock having a secondary or intermediate chamber. The sample is transferred first from the atmosphere into the intermediate chamber which is then sealed and evacuated. Subsequently, the sample is transferred into the instrument chamber. U.S. Pat. Nos. 2,666,539; 2,852,683; 2,910,590; and 3,218,457 illustrate various prior art systems.

Among the several objects of the present invention may be noted the provision of a system for introducing a sample into an evacuated compartment without venting the chamber and without requiring an intermediate air lock chamber which must be repeatedly evacuated and vented; the provision of such apparatus which admits very little air into the evacuated chamber during the introduction of a sample; the provision of such an apparatus which may be simply and rapidly operated; and the provision of such apparatus which is reliable and is of relatively simple and inexpensive construction. Other objects and features will be in part apparent and in part pointed out hereinafter.

SUMMARY OF THE INVENTION

Briefly, the apparatus of the present invention is operative to introduce a sample into an evacuated chamber through a port in the chamber. The apparatus involves a plug adopted to releasably engage and seal the port at its inner end and a sample-carrying probe adapted to extend through the port, there being sealing means for maintaining a seal around the probe upon introduction of the probe into the port. Coupling means are provided at the distal end of the probe for selectively engaging and holding the plug, the plug being releasable from the port and re-engagable therewith by the probe. Accordingly, a sample may be introduced into the chamber by the probe which, after introduction into the port, engages and releases the plug from the port and then carries the plug into the chamber.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
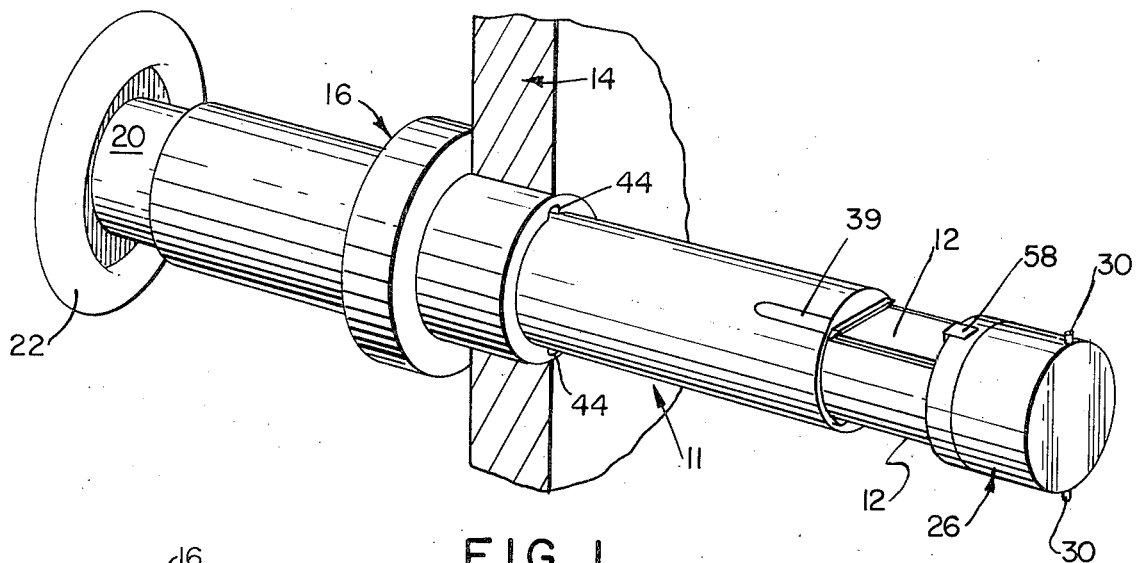
FIG. 1 is a perspective view of a sample introducer in accordance with the present invention.
Figure 2:
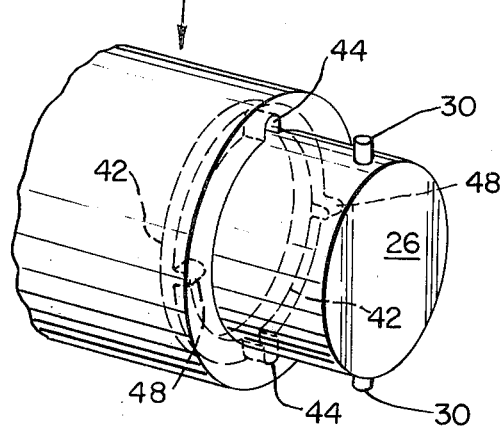
FIGS. 2, 3, 4 and 5 are fragmentary perspective views showing elements of the introducer in FIG. 1 and showing various positions of the elements in the sequence of introducing a sample.

Referring now to FIG. 1, the sample introducer system illustrated there employs a shaft-like probe 11 for introducing a sample into an evacuated chamber and for holding it in position there, e.g. for spectroscopic analysis. In the embodiment illustrated, the samples are carried on flat plates 12 clamped as described hereinafter in lateral recesses cut into the probe shaft. A wall of the evacuated chamber is indicated generally at 14. The probe 11 traverses this wall through a flanged collar or bushing 16 which forms an elongate cylindrical port for receiving the probe. Two O-ring seals 19 and 20 are provided on the inner surface of the port for establishing a seal around the probe and the plug described hereinafter.

The sample plates 12 are mounted at the inner or distal end of the probe and the probe shaft carries at its outer or proximal end a handle 22 for manipulating the probe. By means of this handle, the probe may be rotated so as to position one or the other of the plates 12 at the appropriate location for analysis. Suitable fiducial marks may be employed on the probe and bushing to aid this positioning.

A plug 26 is provided for closing the port when the probe 11 is withdrawn. As is explained in greater detail hereinafter, the probe 11 carries the plug ahead of itself into the chamber when the samples are introduced and for this purpose the probe 11 has at its inner or distal end a threaded stud 27 which is received in a mating bore in the plug.

As mentioned previously, the sample plates 12 are carried in lateral recesses cut into the probe shaft. These plates are clamped, as may be seen in FIGS. 1, 7 and 8, by means of a clamp bar 58 which is received in a transverse opening extending across the probe. The bar is clamped against the plates 12 by a set screw 60, access to the set screw being obtained through a counter bore 64 extending through the stud 27.

Figure 3:
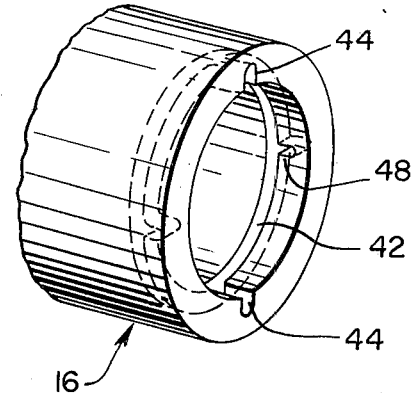

The plug 26 is provided with a pair of radially projecting pins 30 mounted diametrically opposite each other on the plug. As the probe 11 is withdrawn to extract the sample plates 12 from the evacuated chamber and the plug 26 starts to move into the port, the pins 30 and 32 can enter, through respective longitudinal grooves 44, into a circumferential groove 42 which is cut into the inner surface of the bushing 16. Once the pins 30 are in the circumferential groove 42, the plug 26 may be rotated, by means of the probe, so as to bring the pins 30 into alignment with a pair of blind longitudinal grooves 48 which extend only part way from the circumferential groove 42 to the inner face of the port. This angular position can be relatively easily determined by biasing the probe inwardly with respect to the chamber once the rotation is started, a bias which is aided by the vacuum in the chamber. The arrangement of the various grooves is best seen in FIG. 3 in which the end of the port is shown without the plug or the probe, a condition which does not occur in normal operation.

With the pins 30 restrained by the blind grooves or notches 48, the probe 11 may be unscrewed from the plug 26. After the stud 62 has completely disengaged from the plug 26, the introducer may be withdrawn completely from the bushing 16, the vacuum within the chamber being maintained around the plug 26 by the O-ring seal 20.

To introduce new samples, the sequence is essentially reversed. The probe 11 is inserted into the port with a seal being established by the O-rings 18 and 19 before the plug 26 is disengaged from the inner end of the port. If desired, the probe shaft may include a chamfer or flat 39 to permit venting of the space ahead of the probe prior to reaching the plug. With the pins 30 engaged in the blind grooves 48, the probe may be screwed tightly into the plug, pulled back to release the pins from the blind grooves, and then rotated to bring the pins into alignment with the longitudinal slots or grooves 44. As will be understood, the probe may be biased inwardly during the latter part of this rotation so that registration of the pins with the grooves 44 may be readily detected as the probe moves forward into the chamber carrying the plug ahead of it. One or the other of the sample plates 12 may then be appropriately positioned, as described previously. In that samples may be introduced and removed from the chamber without ever completely opening the port, it can be seen that the apparatus of the present invention avoids any need for pumping down the evacuated chamber each time samples are changed. Further, since the volume of the recesses which receive the sample plates may be kept quite small, the amount of air introduced into the chamber with each sample change is essentially negligible.

While it is preferred that the annular groove 42 be completely circumferential as shown, shorter segments might be used which merely traverse the angle between the through slots 44 and the blind slots 48. However, the advantage of the completely circumferential groove is that, if the pins are not in the blind grooves and the probe is rotated counter-clockwise, the pins will not be stopped when they come into alignment with the through grooves. If the annular groove ended at this point, the stem might be unscrewed from the plug 26 and, after uncoupling, the plug might be drawn by the vacuum into the chamber causing explosive venting. In the form illustrated, the apparatus is almost impossible so as to operate in a manner which would cause a loss of the vacuum in this manner.

Figure 4:
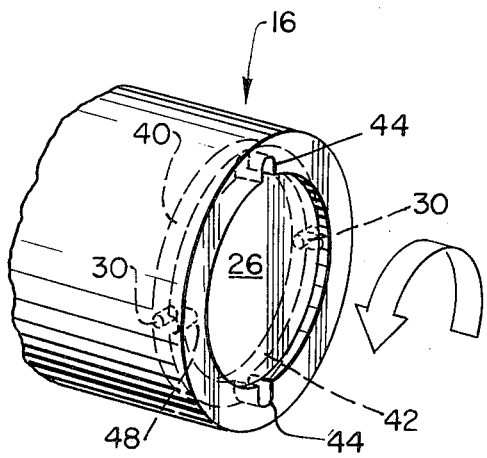
Figure 5:
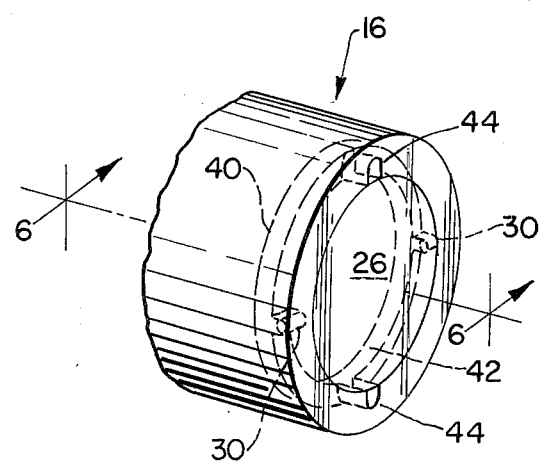
Figure 6:
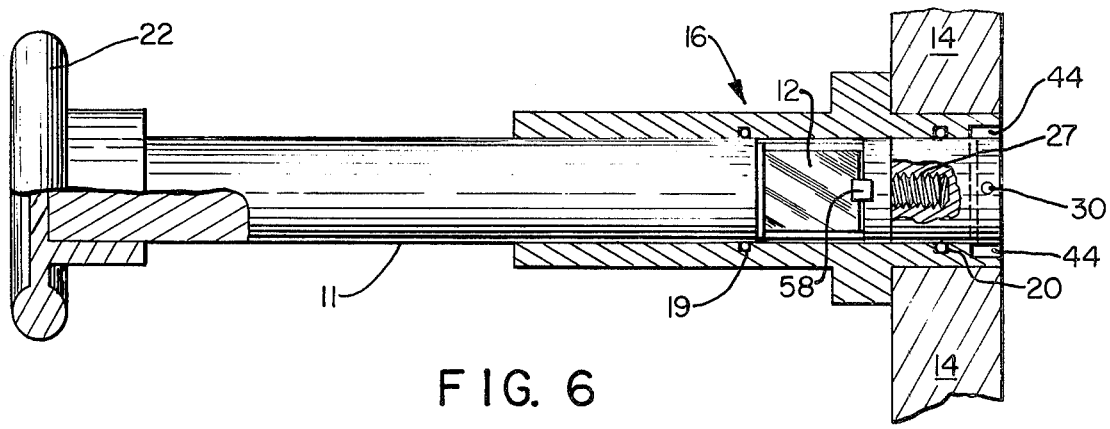
FIG. 6 is a longitudinal cross-section of the introducer of FIG. 1 when in the position shown in FIG. 5 and taken along the line 6—6 of the latter figure.
Figure 7:
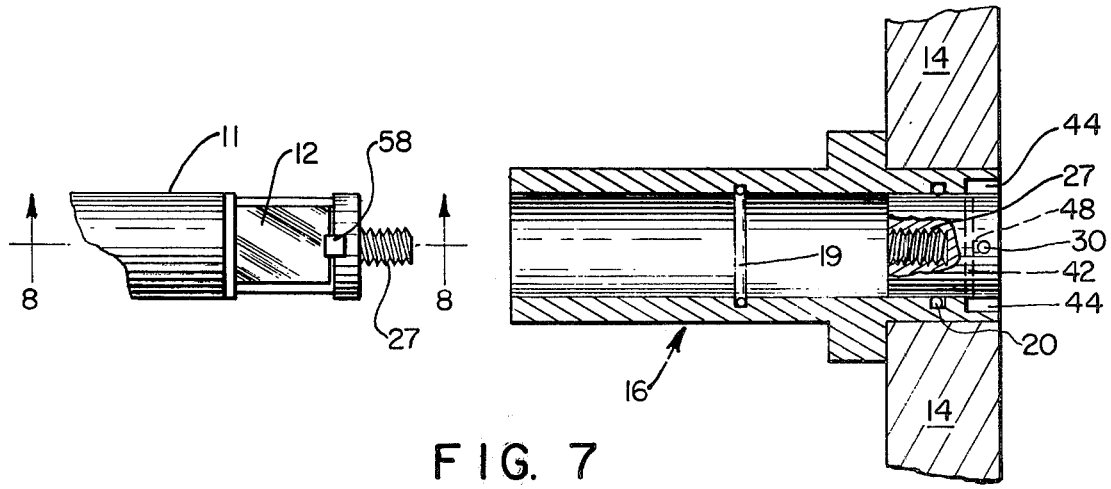
FIG. 7 is a similar cross-sectional view of the introducer of FIG. 1 with the probe and plug separated.
Figure 8:
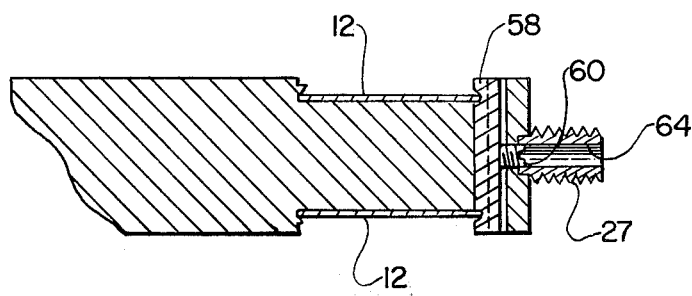
FIG. 8 is a fragmentary cross-sectional view of the introducer probe taken along the line 8—8 of FIG. 7.

The operation of this apparatus may be summarized as follows, starting from the situation illustrated in FIG. 7 where the plug 26 is closing the port and the probe has been withdrawn. Inserting the probe into the bushing establishes a seal around the probe. At this point, the probe may be rotated clockwise to screw the stud 27 into the plug. When the stud is seated, the probe may be withdrawn slightly to move the pins back out of the blind notch as illustrated in FIG. 4. At this point, the probe, with the plug, may be further rotated, preferably still in a clockwise direction as viewed from the handle, so as to bring the pins into alignment with the through slots 44. At this point, the probe may be further advanced to position sample plates 12 within the evacuated chamber, e.g. for analysis.

To again withdraw the probe from the chamber, it is pulled back and rotated until the pins drop into the through slots 44 and further rotation occurs in the circumferential slot 42. Once the pins have dropped into the circumferential slot and a slight rotation has occured to take them beyond the through slots 44, the probe is biased forward as the rotation is continued, until the pins drop into the blind slots 48. At this point, the probe can then be unscrewed from the plug as described previously. As will be understood, it is desirable that all rotations, other than the actual unscrewing of the probe from the plug, take place in a clockwise direction. In that way, the coupling between the probe and the plug is tightened by any residual friction.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for introducing a sample into an evacuated chamber through a port in said chamber, said apparatus comprising:

a plug adapted to releasably engage and seal said port at its inner end;

a sample-carrying probe adapted to extend through said port, there being sealing means for maintaining a seal to said port around said probe upon introduction of the probe into said port; and coupling means at the distal end of said probe for selectively engaging and carrying said plug, said plug being releasable from said port and re-engagable with said port by said probe, whereby a sample may be introduced into said chamber by said probe which, after introduction into said port, engages and releases said plug from the port and carries said plug into said chamber.

2. Apparatus for introducing a sample into an evacuated chamber, said apparatus comprising:

means defining a cylindrical port opening into said chamber;

a cylindrical plug for closing the inner end of said port, said plug having at least one radially projecting pin, said port having an annular groove for accommodating said pin as the plug is rotated within said port, said port having also a first longitudinal groove extending from said annular groove into said chamber and a second, blind, longitudinal groove extending part way from said annular groove to said chamber for holding said plug against rotation;

a generally cylindrical, sample-carrying probe adapted to extend through said port, there being sealing means for maintaining a seal around said probe upon introduction of the probe into said port; and screw threaded coupling means for selectively connecting said probe and said plug, said coupling means being engagable by manipulation of the probe when the plug pin is in said blind longitudinal groove whereby, after engagement of said coupling means, the plug may be manipulated by said probe to pass said pin out through said first longitudinal groove, the probe carrying the plug into said chamber.

3. A sample introducing system as set forth in claim 2 wherein said annular groove is completely circumferential of said port thereby minimizing risk of accidental disengagement of said coupling means.

4. Apparatus for introducing a sample into an evacuated chamber, said apparatus comprising:

means defining a cylindrical port opening into said chamber;

a cylindrical plug for closing the inner end of said port, there being sealing means for sealing said plug to said port, said plug having a pair of radially projecting pins disposed on opposite sides of said plug, said port having a completely circumferential annular groove for accommodating said pin as the plug is rotated within said port, said port having also a pair of through longitudinal grooves extending from said annular groove into said chamber and a pair of blind longitudinal grooves extending part way from said annular groove to said chamber for holding said plug against rotation;

a generally cylindrical, sample-carrying probe adapted to extend through said port, there being sealing means for maintaining a seal around said probe upon introduction of the probe into said port, said sealing means being effective before said probe reaches said plug; and screw threaded coupling means for selectively connecting said probe and said plug, said coupling means being engagable by manipulation of the probe when the plug pins are in said blind longitudinal grooves whereby, after engagement of said coupling means, the plug may be manipulated by said probe to pass said pins out through said annular groove and said longitudinal grooves, the probe carrying the plug into said chamber.

5. Apparatus as set forth in claim 4 wherein said probe has a laterally facing recess for receiving a sample.

6. Apparatus as set forth in claim 4 wherein said probe has a plurality of laterally facing recesses for receiving samples, a selected sample being moveable to operative position by rotation of said probe.

* * * * *